(12) United States Patent
Nestorov

(10) Patent No.: US 12,198,922 B2
(45) Date of Patent: Jan. 14, 2025

(54) LAMP FILAMENT HAVING A PITCH GRADIENT AND METHOD OF MAKING

(71) Applicant: Applied Materials, Inc., Santa Clara, CA (US)

(72) Inventor: Vilen K. Nestorov, Pleasanton, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 278 days.

(21) Appl. No.: 17/947,819

(22) Filed: Sep. 19, 2022

(65) Prior Publication Data

US 2023/0017852 A1 Jan. 19, 2023

Related U.S. Application Data

(63) Continuation-in-part of application No. 17/200,112, filed on Mar. 12, 2021, now Pat. No. 11,460,413.

(Continued)

(51) Int. Cl.
*G01N 21/88* (2006.01)
*C23C 16/48* (2006.01)
(Continued)

(52) U.S. Cl.
CPC ............ *H01K 1/14* (2013.01); *C23C 16/482* (2013.01); *F27B 17/0025* (2013.01); *H01K 1/16* (2013.01);
(Continued)

(58) Field of Classification Search
CPC ....... G01B 11/022; G01B 11/02; F21V 29/10; G01N 21/95; G01N 21/66; G01N 21/8851;
(Continued)

(56) References Cited

U.S. PATENT DOCUMENTS

| 4,291,444 A | 9/1981 | McCarty et al. |
| 4,506,187 A * | 3/1985 | Hofmann ............... H01H 36/02 313/344 |

(Continued)

FOREIGN PATENT DOCUMENTS

| CN | 109521029 A | 3/2019 |
| DE | 102012202081 A1 | 8/2013 |

(Continued)

OTHER PUBLICATIONS

International Search Report and Written Opinion for PCT/US2021/022062 dated Jun. 25, 2021.

(Continued)

*Primary Examiner* — Sang H Nguyen
(74) *Attorney, Agent, or Firm* — Patterson + Sheridan, LLP

(57) ABSTRACT

Examples disclosed herein relate to a to a pitch gradient in a lamp filament, and a method of making. In one implementation, a lamp has a bulb filled with a gas. A filament is disposed within the bulb. The filament has a plurality of coils that include a first coil having a first point. The plurality of coils includes a second coil having a second point, and a third coil having a third point. The pitch gradient is defined by a first pitch between the second point and the first point, and a second pitch between the third point and the second point. The second pitch is greater than the first pitch. The second point is 360 degrees away from the first point. The third point is 360 degrees from the second point. A terminal coil is electrically coupled to at least the first coil, the second coil, and the third coil.

18 Claims, 4 Drawing Sheets

Related U.S. Application Data

(60) Provisional application No. 63/248,284, filed on Sep. 24, 2021, provisional application No. 62/989,451, filed on Mar. 13, 2020.

(51) Int. Cl.

| | | |
|---|---|---|
| *F27B 17/00* | (2006.01) | |
| *G01N 21/66* | (2006.01) | |
| *H01K 1/14* | (2006.01) | |
| *H01K 1/16* | (2006.01) | |
| *H01K 3/02* | (2006.01) | |
| *H01K 7/00* | (2006.01) | |
| *H05B 3/00* | (2006.01) | |

(52) U.S. Cl.
CPC ............... *H01K 3/02* (2013.01); *H01K 7/00* (2013.01); *H05B 3/0047* (2013.01); *H05B 2203/007* (2013.01); *H05B 2203/016* (2013.01); *H05B 2203/017* (2013.01)

(58) Field of Classification Search
CPC .. H01K 1/14; H01K 1/16; H01K 7/00; H01K 3/02; H05B 3/0047; H05B 2203/017; H05B 2203/016; H05B 2203/007; F27B 17/0025; C23C 16/582
See application file for complete search history.

(56) References Cited

U.S. PATENT DOCUMENTS

| | | | |
|---|---|---|---|
| 4,918,354 A | | 4/1990 | Johnson, Jr. |
| 5,079,478 A | * | 1/1992 | Ikeda ................. H01J 61/0672 313/492 |
| 6,048,082 A | | 4/2000 | Washimoto |
| 6,099,148 A | | 8/2000 | Northrup et al. |
| 6,465,939 B1 | * | 10/2002 | Ward ....................... H01J 1/18 313/271 |
| 6,661,030 B2 | | 12/2003 | Komoto et al. |
| 6,966,811 B2 | * | 11/2005 | Weyhrauch ............. H01K 3/08 445/32 |
| 7,612,491 B2 | | 11/2009 | Ranish et al. |
| 8,106,591 B2 | | 1/2012 | Serebryanov et al. |
| 8,314,368 B2 | | 11/2012 | Ranish et al. |
| RE44,712 E | | 1/2014 | Ranish et al. |
| 2001/0010308 A1 | | 8/2001 | Hauf et al. |
| 2002/0105638 A1 | | 8/2002 | Kobayashi |
| 2002/0135302 A1 | | 9/2002 | Sakai et al. |
| 2004/0013418 A1 | | 1/2004 | Kusuda et al. |
| 2004/0070324 A1 | | 4/2004 | Lisitsyn |
| 2006/0066193 A1 | | 3/2006 | Ranish et al. |
| 2009/0236988 A1 | * | 9/2009 | Iida ....................... H01J 61/327 313/631 |
| 2010/0302521 A1 | | 12/2010 | Kuiper |
| 2011/0210273 A1 | | 9/2011 | Kurt et al. |
| 2013/0223824 A1 | | 8/2013 | Myo |
| 2014/0111080 A1 | * | 4/2014 | Bilikova ................... H01J 9/04 313/155 |
| 2018/0326660 A1 | | 11/2018 | Gifford et al. |
| 2019/0110336 A1 | | 4/2019 | Cong et al. |
| 2019/0318444 A1 | | 10/2019 | Juarez et al. |
| 2019/0355569 A1 | * | 11/2019 | Yasuda .................... H01K 1/16 |
| 2020/0132257 A1 | * | 4/2020 | Hong ....................... F21K 9/90 |
| 2020/0182413 A1 | * | 6/2020 | Jiang ..................... H05B 45/20 |
| 2021/0028075 A1 | | 1/2021 | Zhu et al. |
| 2021/0285892 A1 | | 9/2021 | Raj et al. |

FOREIGN PATENT DOCUMENTS

| | | |
|---|---|---|
| JP | 2000106295 A | 4/2000 |
| JP | 2002513927 A | 5/2002 |
| JP | 2003139519 A | 5/2003 |
| JP | 2003288596 A | 10/2003 |
| JP | 2004151057 A | 5/2004 |
| JP | 3119435 U | 3/2006 |
| JP | 2015065006 A | 4/2015 |
| JP | 2015207516 A | 11/2015 |
| JP | 2016102717 A | 6/2016 |
| KR | 19980050030 A | 9/1998 |
| KR | 20080012748 A | 2/2008 |
| KR | 20090128995 A | 12/2009 |
| KR | 20100082469 A | 7/2010 |
| KR | 101463120 B1 | 11/2014 |

OTHER PUBLICATIONS

Non-Final Office Action dated Jun. 7, 2022 for U.S. Appl. No. 17/200,112.
Japanese Office Action dated Jun. 27, 2023 for Application No. 2022-555180.
Non-Final Office Action dated Mar. 9, 2023 for U.S. Appl. No. 17/947,791.
Japanese Office Action dated Oct. 17, 2023 for Application No. 2022-555180.
International Search Report and Written Opinion dated Dec. 27, 2022 for Application No. PCT/US2022/043990.

* cited by examiner

LAMP FILAMENT HAVING A PITCH GRADIENT AND METHOD OF MAKING

CROSS-REFERENCE TO RELATED APPLICATIONS

This application is a continuation-in-part of U.S. Non-Provisional patent application Ser. No. 17/200,112 filed Mar. 12, 2021 which claims priority to U.S. Provisional Patent Application Ser. No. 62/989,451 filed Mar. 13, 2020 each of which is incorporated by reference herein in its entirety. This application also claims priority to U.S. Provisional Patent Application Ser. No. 63/248,284 filed Sep. 24, 2021, which is incorporated by reference herein in its entirety.

BACKGROUND

Field

Examples disclosed herein relate to a pitch gradient in a lamp filament, and a method of making the same.

Description of the Related Art

In substrate processing chambers, such as epitaxial deposition chambers, a quality of the deposited material can depend, among other things, on the uniformity of the temperature of the substrate. Control of a heat source is one manner of influencing a heat profile of the temperature across the substrate. Maintaining a consistent heat profile across the substrate facilitates greater uniformity for deposited material on the substrate between routine maintenance procedures.

When the heat source is a conventional lamp, the size, shape, and angle of the lamp directly correspond to the heat profile, and therefore affect the quality of material deposited on the substrate. Conventional approaches to increasing the useful lifespan of the lamp include optimizing gases within the lamp, or changing the materials that make up the filament or lamp housing. When new or replacement lamps are used, the replacement lamps can introduce heat profile variations due to the differences between the used lamps and replacement lamps. As such, replacement lamps can influence the heat uniformity profile across the substrate, thus involving additional measures to ensure a consistent heat profile to ensure that deposition of material is not adversely affected by the replacement lamps.

Therefore, there is a need for an improved heat lamp for use in substrate processing chambers.

SUMMARY

Disclosed herein is a method and apparatus for forming a pitch gradient in filament used in a heat lamp configured to heat a semiconductor substrate. In one example, a lamp is provided, the lamp having a bulb filled with a gas. A filament is disposed within the bulb. The filament has a plurality of coils, and the plurality of coils includes a first coil having a first point. The plurality of coils also includes a second coil having a second point, and a third coil having a third point. The first point, second point, and third point form a pitch gradient. The pitch gradient is defined by a first pitch between the second point and the first point, and a second pitch between the third point and the second point. The second pitch is greater than the first pitch. The second point is 360 degrees away from the first point. The third point is 360 degrees away from the second point. A terminal coil is electrically coupled to at least the first coil, the second coil, and the third coil.

In one example, a semiconductor processing chamber is provided that has a lamp configured to provide heat to an internal volume of the semiconductor processing chamber. The lamp has a bulb filled with a gas. A filament is disposed within the bulb, the filament has a plurality of coils. The plurality of coils includes a first coil having a first point, a second coil having a second point, and a third coil having a third point. The first point, second point, and third point form a pitch gradient. The pitch gradient is defined by a first pitch between the second point and the first point, and a second pitch between the third point and the second point. The second pitch is greater than the first pitch, and the second point is 360 degrees away from the first point. The third point is 360 degrees away from the second point. A terminal coil is electrically coupled to at least the first coil, the second coil, and the third coil.

In one example, a method of forming a lamp includes disposing a filament in a bulb filled with a gas, the filament includes a plurality of coils. The method includes forming a pitch gradient between a first coil having a first point, a second coil having a second point, and a third coil having a third point. The pitch gradient is defined by a first pitch between the second point and the first point, and a second pitch between the third point and the second point. The second pitch is greater than the first pitch. The second point is 360 degrees away from the first point, and the third point is 360 degrees away from the second point.

BRIEF DESCRIPTION OF THE DRAWING

Disclosed herein is a method and apparatus for forming a pitch gradient in a filament used in a heat lamp configured to heat a semiconductor substrate. So that the above recited features of the present disclosure can be understood in detail, a more particular description of the disclosure, briefly summarized above, may be had by reference to examples herein, some of which are illustrated in the appended drawings. However, it is to be noted that the appended drawings illustrate only examples and are therefore not to be considered limiting of the disclosure's scope. Accordingly, the appending drawings admit to other equally effective examples.

In order to facilitate understanding, identical reference numerals have been used, where possible, to designate identical elements that are common features. It is contemplated that elements and features of one example may be beneficially incorporated into other examples without further recitation.

DETAILED DESCRIPTION

Disclosed herein is a filament for use in a heat lamp. The filament has a pitch gradient configured to facilitate reduced deformation of the filament, thus facilitating a prolonged useable lifespan of the lamp. The filament is made of a material that radiates light and heat when an electric current is passed therethrough. The filament can be disposed in a gaseous environment that is designed to further extend the useable lifespan of the lamp. The lamp can provide radiation from the visible to the near-infrared range. A substrate absorbs radiation from the lamps, thus increasing its temperature and suitability for depositing material. Advantageously, extending the useful lifespan of the lamp reduces the frequency of replacing lamps with replacement lamps, thus reducing costs and facilitating enablement of the heat profile to be maintained for a longer period of time.

A conventional lamp can have a substantially uniform pitch between adjacent coils of the filament, and therefore the filament does not have a gradient. Heating and cooling of the filament wire slightly deforms the metal wire, which over several thousand process runs can cause deformation of the entire filament. As such, the conventional filament tends to sag in the direction of gravity until adjacent coils touch, thus eliminating the pitch between the coils and causing lamp failure. In contrast, the method and apparatus disclosed herein facilitate a pitch gradient among the plurality of pitches in a filament. As such, the variations in pitches along the filament significantly extend the useful lifetime of the lamp by maintaining a pitch between adjacent coils when the filament is subject to metal fatigue caused by heating and cooling. Advantageously, a lamp using the filament disclosed herein can extend a useful lifespan of the lamp by up to twenty (20) to twenty-five (25) percent longer than a conventional lamp.

Figure 1:
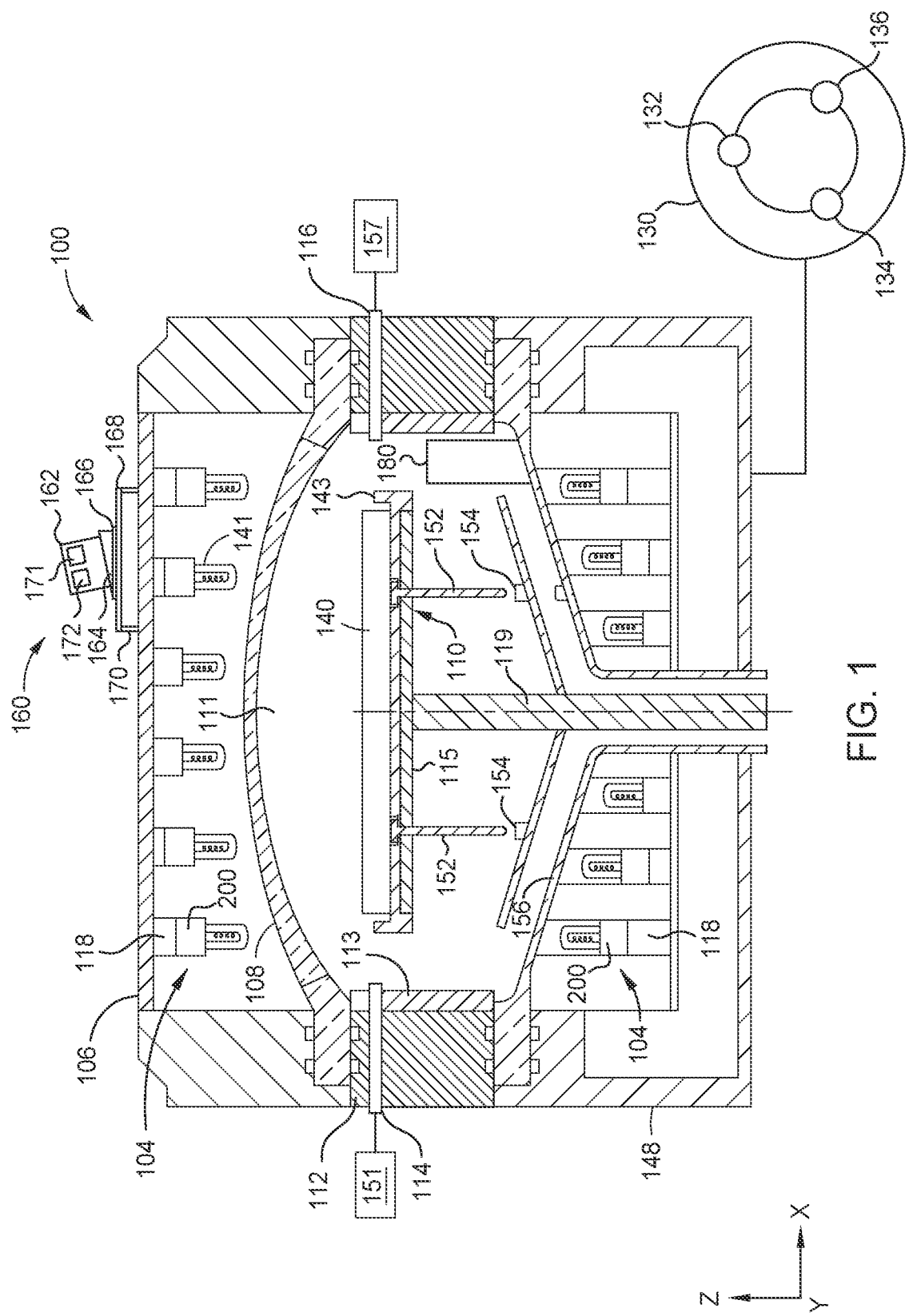
FIG. 1 shows a schematic cross-sectional view of an exemplary processing chamber configured to process one or more semiconductor substrates, according to one implementation.

FIG. 1 shows a schematic cross-sectional view of an exemplary processing chamber 100 configured to process one or more semiconductor substrates, according to one implementation. The processing chamber 100 may be used to process one or more substrates therein, including the processes of depositing a material on a substrate 140, heating of the substrate 140, etching of the substrate 140, or combinations thereof. The processing chamber 100 includes a chamber wall 148, and an array of radiant heat assemblies 104 for heating, among other components, a substrate support 110 disposed within the processing chamber 100. Each radiant heat assembly 104 includes a lamp 200 (shown in FIG. 2) and a lamp mounting module 118.

The radiant heat assemblies 104 heat the substrate support 110 and the substrate 140 as a process gas or vapor passes over the surface of the substrate 140, facilitating the deposition of a material onto the device side of the substrate 140. As shown in FIG. 1, the array of radiant heat assemblies 104 may be disposed below and/or above the substrate support 110.

The substrate support 110 includes a substrate support 115 and is located within the processing chamber 100 between a ceiling 108 (such as a window), which may be a dome or any other shape, and an energy transmissive member 156 (such as a window), which may also be a dome or any other shape. The ceiling 108 and the energy transmissive member 156, along with a body 112 that is disposed between the ceiling 108 and energy transmissive member 156, generally define an internal volume 111 of the processing chamber 100. The ceiling 108 and/or the energy transmissive member 156 may be optically transparent to high-energy radiant radiation (transmitting at least 95% of the radiation of the high-energy radiant radiation). Further, the ceiling 108 and the energy transmissive member 156 may be fabricated from quartz. Additionally, the array of radiant heat assemblies 104 may be disposed above the ceiling 108, in one or more examples.

The radiant heat assemblies 104 are configured to heat the substrate 140 during processing. As such, the radiant heat assemblies 104 may heat the substrate 140 to a temperature within a range of about 200 degrees Celsius to about 1,600 degrees Celsius. Each radiant heat assembly 104 can be coupled to a power distribution board through which power is supplied to each radiant heat assembly 104. The radiant heat assembly 104 is positioned within a housing, which is configured to be cooled during or after processing by, for example, using a cooling fluid introduced into channels located between the radiant heat assemblies 104.

The substrate 140 is transferred into the processing chamber 100 and positioned onto the substrate support 110 through a loading port (not shown) formed in the body 112. A process gas inlet 114 and a gas outlet 116 are provided in the body 112.

A robot (not shown) enters the processing chamber 100 to engage at least the underside of the substrate 140 and remove the substrate 140 therefrom through the loading port. A new substrate may then be loaded onto the lift pins 152 by the robot, and the substrate support 110 may then be actuated up to place the substrate 140 disposed on the substrate support 110. The lift pins 152 may include an enlarged head allowing the lift pins 152 to be suspended in openings in the substrate support 110 when in the processing position. The substrate support 110, while located in the processing position, divides the internal volume of the processing chamber 100 into a process gas region above the substrate support 110, and a purge gas region below the substrate support 110.

Substrate temperature is measured by sensors configured to measure temperatures at the bottom of the substrate support 110. The sensors may be pyrometers (not shown) disposed in ports formed in the housing of the processing chamber (e.g., the processing chamber 100).

Process gas supplied from a process gas supply source 151 is introduced into a process gas region through the process gas inlet 114 formed in the sidewall of the body 112. The process gas inlet 114 is configured to direct the process gas in a generally radially inward direction. In one or more examples, the process gas inlet 114 is a side gas injector. The side gas injector is positioned to direct the process gas across a surface of the substrate support 110 and/or the substrate 140. During a film formation process for forming a film layer on the substrate 140, the substrate support 110 is located in the processing position, which is adjacent to and at about the same elevation as the process gas inlet 114. The process gas flows generally across the upper surface of the substrate support 110 and/or the substrate 140. The process gas exits the process gas region through the gas outlet 116 located on the opposite side of the processing chamber 100 from the process gas inlet 114. Removal of the process gas through the gas outlet 116 here is facilitated by a vacuum pump 157 coupled thereto.

The processing chamber 100 includes a sensing device 160. The sensing device 160 may be mounted to a lid 106 of the processing chamber 100. Alternatively, the sensing device 160 may be mounted to an element (not shown) external to the processing chamber 100. Further, the sensing device 160 may receive sensor data corresponding to the thermal radiation of a film on a target element, such as a portion of the substrate support 110. The sensing device 160 may determine a thickness of the film from the sensor data or communicate the sensor data to a controller 130 and the controller 130 is configured to determine the thickness of the film from the sensor data.

The target element may be at least a portion of the surface 143 of the substrate support 110. The target element may be any portion of the surface 143 that is not covered by the substrate 140 during processing. For example, the target element may be the surface 143 of an edge region of the substrate support 110. Alternatively, the target element may be an inner portion of the inner surface 113.

During a deposition process, as material is deposited onto the substrate 140 to form a film, the material is also deposited on a target element. For example, during a deposition process, as material is deposited onto the substrate 140 to form a film, the material is also deposited on a target element, e.g., the surface 143 of the substrate support 110, or the inner surface 113. Further, during an etch process, as material is removed from the substrate 140 to alter the thickness of a film on the substrate 140, the material is also removed from a film formed on a target element. For example, during an etching process, as material is removed from the substrate 140, the material is also removed from a film formed on one or more of the surface 143 of the substrate support 110 and/or the inner surface 113 at a corresponding rate. Thus, the thickness of the film on the target element corresponds to the thickness of the film on the substrate 140. Accordingly, monitoring the thickness of the film on the target element allows for the monitoring the thickness of the film on the substrate 140.

The sensing device 160 includes a sensor 162, an angled mounting element 164, a mounting block 166, a mounting plate 168, and a reflector 170. The sensor 162 may include a radiation thermometer, an emissivity sensor, and/or a pyrometer, among others. For example, the sensor 162 may be a radiation thermometer and the sensor data may correspond to a thermal radiation intensity of a film deposited on the target.

The angled mounting element 164, the mounting block 166, the mounting plate 168, and the reflector 170 may each be independent elements. Alternatively, two or more of the angled mounting element 164, the mounting block 166, the mounting plate 168, and the reflector 170 may be combined into a single element. For example, the angled mounting element 164 may be part of the mounting block 166. Further, the reflector 170 may be part of the mounting plate 168. Additionally, or alternatively, the mounting block 166 may be part of the mounting plate 168. One or more of the angled mounting element 164, the mounting block 166, the mounting plate 168, and/or the reflector 170 may be omitted. For example, the mounting block 166 may be omitted and the angled mounting element 164 may be mounted directly to the mounting plate 168.

The sensor 162 is mounted on the angled mounting element 164 such that the sensor 162 is mounted at an angle relative to a surface of the target element. For example, the sensor 162 may be mounted at an angle of about 0 degrees to about 90 degrees relative to the target element. In one or more examples, the sensor 162 may be mounted at angles greater than about 90 degrees relative to the target element.

The sensor 162 may include an optical system 171 and detector 172. The optical system 171 may include one or more lenses that focus the energy within the thermal radiation signals emitted by the film on the target element and onto the detector 172. The detector 172 is sensitive to the radiation and generates sensor data corresponding to the radiation within the thermal radiation signal. The detector 172 may be responsive to various wavelengths of light. For example, the detector 172 may be responsive to energy radiated from a target element in a wavelength range of about 700 nm to about 1300 nm. As another example, the detector 172 may be responsive to energy radiated from a target element in a wavelength less than about 700 nm or greater than about 1300 nm. The sensor data generated by the detector 172 may be proportional to the amount of energy radiated by the target element. The sensor data may be processed to determine or infer the temperature of the target element.

The mounting plate 168 may be used to mount the sensing device 160 to the lid 106 or another element such that the sensing device 160 is able to receive thermal radiation signals from a target element within the processing chamber 100. The reflector 170 includes a reflective inner surface and directs thermal radiation signals on the sensor 162. As detailed above, the reflector 170 may be part of the mounting plate 168.

The processing chamber 100 includes a controller 130 to control the operation of the processing chamber 100 during processing. For example, the controller 130 is configured to control flow of various precursor and process gases and purge gases from gas sources, during different operations of a substrate processing sequence. By way of further example, the controller 130 is configured to control a firing of a spot heating module, feeding of gases, lamp operation, or other process parameters, among other controller operations. The controller 130 is utilized to control the operation of the processing chamber 100. For example, the controller 130 may control the operation of the radiant heat assembles 104, the gas supply source 151, the vacuum pump 157, and/or the sensor 160. The controller 130 can be configured to conduct the method 500 (see FIG. 5). The present disclosure contemplates that a controller (which can be similar to the controller 130) which does not control the processing chamber 100 can be configured to conduct the method 500 (see FIG. 5).

The controller 130 can include a processor 132, memory 134, and support circuits 136 for the processor 132 and facilitates control of the components of the processing chamber 100. The controller 130 may be one of any form of general-purpose computer processor that can be used in an industrial setting for controlling various chambers and sub-processors. The memory 134 stores software (source or object code) that may be executed or invoked to control the operation of the processing chamber 100 in the manner described herein. The memory 134 is non-transitory and may be one or more of readily available memory such as random access memory (RAM), read only memory (ROM), or any other form of digital storage, local or remote. The memory 134 contains instructions that, when executed by the processor 132, facilitate execution of the method 500 (shown in FIG. 5).

To facilitate control of the processing chamber 100, the processor 132 may be one of any form of general purpose computer processor, or a general purpose central processing unit (CPU), each of which can be used in an industrial setting, such as a programmable logic controller (PLC), for controlling various chambers and sub-processors. The memory 134 is coupled to the processor 132, and the memory 134 may be one or more of readily available memory such as random access memory (RAM), dynamic random access memory (DRAM), static RAM (SRAM), synchronous dynamic RAM (SDRAM (e.g., DDR1, DDR2, DDR3, DDR3L, LPDDR3, DDR4, LPDDR4, and the like)), read only memory (ROM), floppy disk drive, hard disk, flash drive, or any other form of digital storage, local or remote. Support circuits 136 are coupled to the processor 132 for supporting the processor. The support circuits 136 can include cache, power supplies, clock circuits, input/output circuitry and subsystems, and the like. Charged species generation, heating, and other processes can be stored in the memory 134, typically as software routine. The software routine may also be stored and/or executed by a second CPU (not shown) that is remotely located from the processing chamber 100 being controlled by the processor 132.

The memory 134 (a non-transitory computer readable medium) is in the form of computer-readable storage media that contains instructions, that when executed by the processor 132, facilitates the operation of the processing chamber 100 and/or execution of the method 500 (see FIG. 5). The instructions in the memory 134 are in the form of a program product such as a program that implements the method of the present disclosure. The program code may conform to any one of a number of different programming languages. In one or more examples, the disclosure may be implemented as a program product stored on a computer-readable storage media for use with a computer system. The program(s) of the program product define functions of the examples (including the methods described herein). Illustrative computer-readable storage media include, but are not limited to: (i) non-writable storage media (e.g., read-only memory devices within a computer such as CD-ROM disks readable by a CD-ROM drive, flash memory, ROM chips, or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored. Such computer-readable storage media, when carrying computer-readable instructions that direct the functions of the methods described herein, are examples of the present disclosure.

Figure 2:
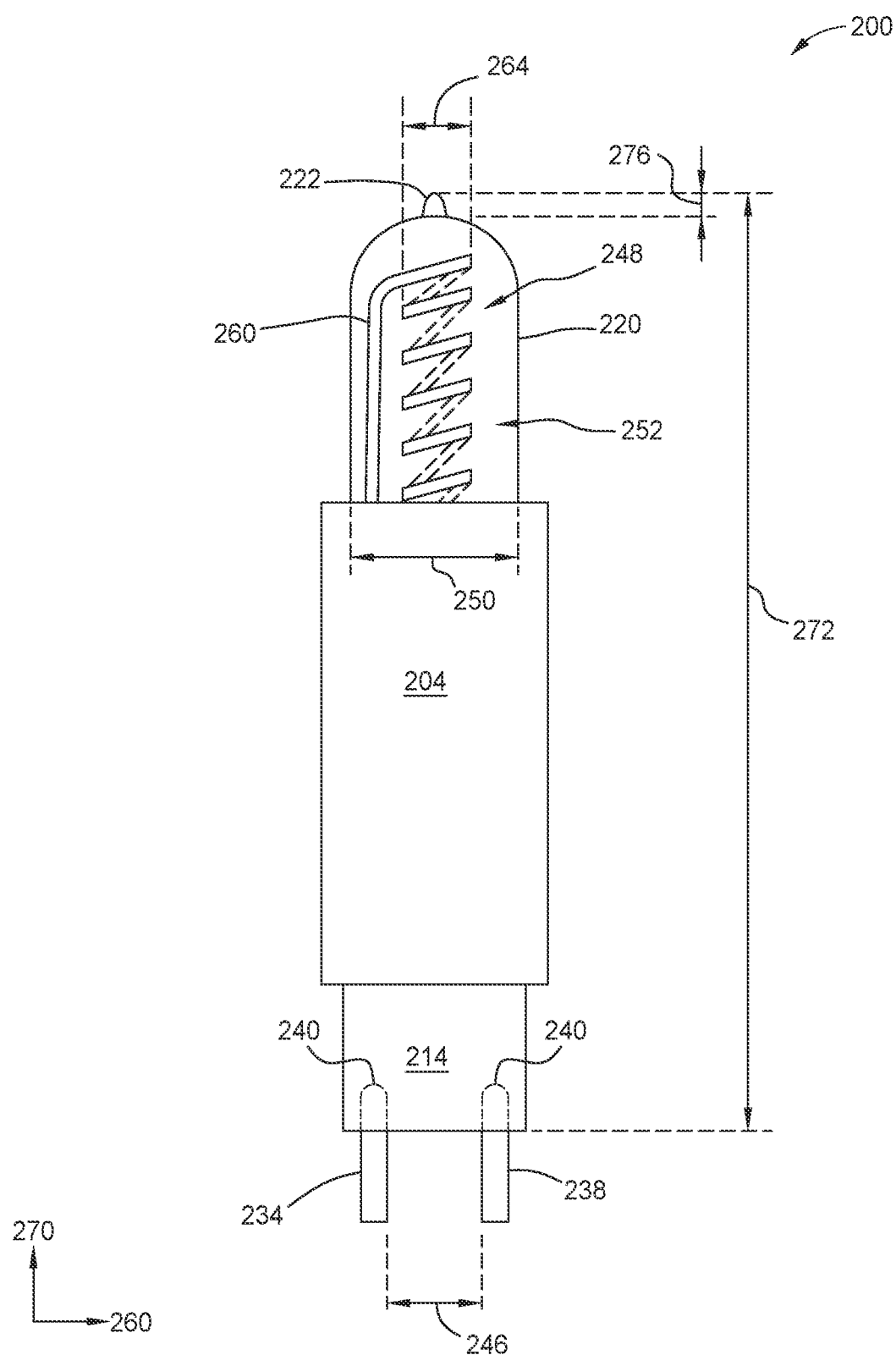
FIG. 2 illustrates a front plan view of a lamp that can be used as the lamp in the processing chamber of FIG. 1, according to one implementation.

FIG. 2 is a frontal plan view of the exemplary lamp 200 that can be used in the processing chamber 100 shown in FIG. 1B, according to one implementation. The lamp 200 has a base 204, a dome 220, and a pin section 214. In one or more examples, the dome 220 may be a dome in the general shape of a cylinder, where one end of the cylinder may have a hemispherical end. The lamp 200 may also have a tip 222 at one end of the dome 220. In one or more examples, the dome 220 is made of quartz, and/or other suitable material(s).

The lamp 200 includes a filament 248 disposed within the dome 220. The filament 248 has an outer diameter 264. The filament 248 is formed from a wire 308 (shown in FIG. 3). The filament 248 includes a coiled section 252 that extends in a y-direction 270 within an interior of the dome 220. Stated differently, the coiled section 252 of the filament 248 extends in the y-direction 270 aligned with the long axis of the lamp 200. The coiled section 252 is substantially helical, but may have other shapes. The filament 248 is attached to a ground wire 260.

The pin section 214 includes a first pin 234 and a second pin 238 (e.g., a pair of pins). The first pin 234 and the second pin 238 are configured to be coupled to a pair of electrodes 240 disposed within the lamp mounting module 118. The base 204 may include circuits, and other components used to couple the filament 248 and/or the ground wire 260 to the first pin 234 and the second pin 238. The first and second pins 234, 238 are configured to transfer energy to the filament 248.

A first length 272 of the lamp 200 is defined between a distal end of the tip 222 to a bottom of the pin section 214 (excluding the pins 234, 238). A height 276 of the tip 222 is less than 1 mm. The first length 272 of the lamp 200 is between about 120 mm and 135 mm. In one or more embodiments, the first length 272 is about 125 mm. In one or more embodiments, the first length 272 is about 127 mm. A width 246 between the first pin 234 and the second pin 238 is between about 6 mm to about 8 mm. The dome 220 has an exterior diameter 250 of between about 11 mm to about 17 mm. The outer diameter 264 of the coiled section 252 of the filament 248 is between about 3 mm to about 7 mm. It is contemplated that other geometries may be utilized for various applications.

In operation, an electrical current is applied to the filament 248, causing the filament 248 to radiate light and heat. In one or more examples of the present disclosure, the filament is made of tungsten or other suitable conductor. Tungsten filaments radiate infrared radiation at temperatures up to about 3,422° C. It is to be understood that other metals may be utilized without departing from the scope of the disclosure. The dome 220 (e.g., a quartz bulb) is filled with at least one gas that is configured to extend the lifetime of the filament 248. The gas may have a low level of reactivity, such as one or more noble gases. Other gases may also be present in the bulb. The gas(es) reduces the rate at which the filament 248 disintegrates, and therefore extends the lifetime of the lamp 200.

Figure 3:
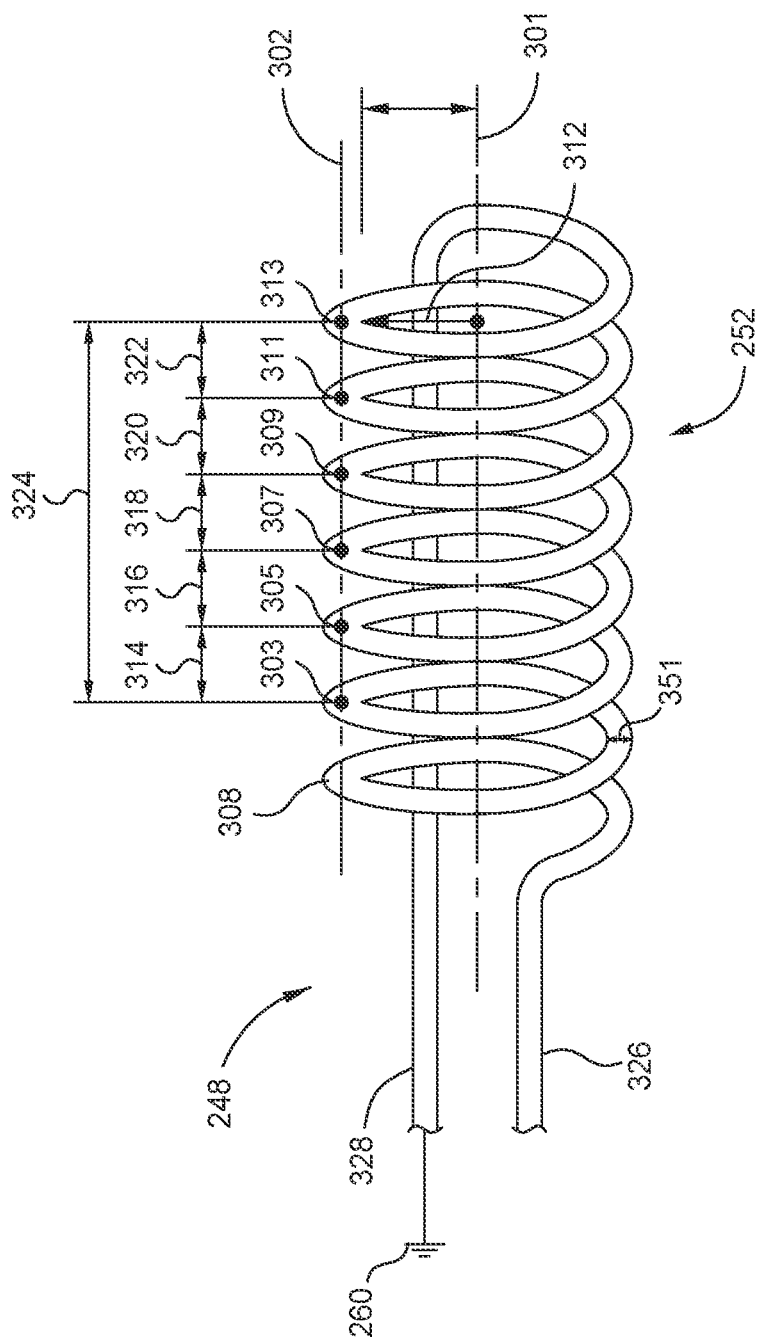
FIG. 3 illustrates a filament suitable for use in the lamp of FIG. 2, according to one implementation.

FIG. 3 illustrates a filament 248 suitable for use in the lamp 200 of FIG. 2, according to one implementation. A portion of the filament 248 has a pitch gradient 324. An upstream terminal 326 and a downstream terminal 328 are shown. In one or more embodiments, the wire 308 of the filament 248 has a diameter 351 that is less than or equal to about 0.05 mm. The filament 248 can be configured such that current flows into the upstream terminal 326 and out of the filament through the downstream terminal 328 that is coupled to ground 260. Considering an imaginary line 302 extending parallel to a central axis 301, a pitch is defined as a center to center distance from a first point 303 on the wire 308 that intersects the imaginary line to a second point 305 on the wire 308 that intersect the imaginary line. The second point 305 on the wire 308 is about 360 degrees from the first point 303 along a helical circumference of the wire 308. A pitch is defined as the difference between two adjacent points, e.g., the first point 303 and the second point 305. The pitch gradient 324 is defined as the difference(s) between two or more pitches (such as the differences between magnitudes of two or more of the pitches 314-322). For example, the pitch gradient 324 can be the difference between the first pitch 314 and the second pitch 316, e.g., a difference between a magnitude of a first pitch 314 and a magnitude of a second pitch 316. As such, the pitch gradient 324 can include a difference between three or more points, such as a difference between a first point 303 and the second point 305, and a difference between the second point 305 and a third point 307. The third point 307 is about 360 degrees apart (e.g., a radial distance away) from the second point 305, and about 720 degrees apart from the first point 303 along the circumference of the wire 308. It is understood that additional points are about 360 degrees away from adjacent points on the wire 308. The wire 308 extends from the central axis 301 at a constant radius 312 forming a helical pattern along the length of the central axis 301.

The first pitch 314 is defined as a distance between the first point 303 and the second point 305. The second pitch 316 is defined as a distance between the second point 305 and the third point 307. A third pitch 318 is defined as a distance between the third point 307 and a fourth point 309. A fourth pitch 320 and fifth pitch 322 are defined similarly, as a distance between adjacent points 309-313. In the example illustrated, the first pitch 314 is less than the second pitch 316, and the second pitch 316 is less than the third pitch 318. As such, the pitch gradient 324 of the filament 248 increases in a direction extending from the first point 303 to a sixth point 313. Accordingly, the pitch gradient 324 increases from the first pitch 314 to a fifth pitch 322, such that each adjacent pitch increases in the direction of the pitch gradient 324. The pitch gradient 324 can be linear or non-linear.

In one example, the pitch gradient 324 of the filament 248 increases in the direction of gravity. The first point 303 is closer to the base 204 than the tip 222 of the dome 220. Conversely, the sixth point 313 is closer to the tip 222 of the dome 220 than the base 204. When the filament 248 is disposed in the lamp 200, the first pitch 314 is adjacent the base 204 and is less than the second pitch 316, and the second pitch 316 is less than the third pitch 318. The third pitch 318 is closer to the tip 222 than the first pitch 314. Advantageously, when the lamp 200 is installed in the radiant heat assembly 104, the pitch gradient 324 facilitates enabling the filament 248 to maintain an integrity of the coiled section 252. In one or more examples, the integrity of the coiled section 252 is maintained for about 20 percent longer than the conventional lamp (not shown).

After several thousand process runs, heating and cooling of the wire 308 can cause the coiled section 252 of the filament 248 to deform. In a conventional lamp, gravity worsens this deformation as the material of the wire 308 heats and cools, causing greater deformation. This repeated deformation of a conventional filament caused by temperature changes and gravitational pull on the mass of the wire, leads to failure of the conventional lamp. Advantageously, the pitch gradient 324 facilitates impeding the deformation caused by repeated stress caused by heating and cooling of the filament 248, thus enabling the filament 248 to maintain integrity. In one or more examples, after about 20,000 to about 25,000 process runs, the first pitch 314, the second pitch 316, and the third pitch 318 may be substantially equal. In one or more examples, the first pitch 314 through fifth pitch 322 are substantially equal after about 20,000 to about 25,000 process runs.

As described above, the pitch gradient 324 can increase in the direction of gravity. As such, when the filament 248 is installed in the lamp 200 of the processing chamber 100, the first point 303 is closer to the tip 222 of the dome 220 than the second point 305. Accordingly, the first pitch 314 is closer to the substrate support 110 or the substrate 140 than the second pitch 316, or the subsequent pitches 318-322. When the filament 248 is installed in the lamp 200 of the processing chamber 100, the first point 303 is further away from the tip 222 of the dome 220 than the second point 305. As such, the first pitch 314 is further away from the substrate 140 (and the substrate support 115) than the second pitch 316 and the subsequent pitches 318-322.

In one or more examples, a ratio between the last pitch and the first pitch among the pitches 314-324 is between about 2.0 and about 2.3, such as between about 2.05 and about 2.25. In one or more examples, the ratio is between about 2.1 and about 2.15. In one or more examples, where the point 303 is closest to the base 204 and the point 313 is closest to the tip 222, the pitch 314 is between about 1.0 mm and about 1.5 mm, and the pitch 322 is between about 2.0 mm and about 3.45 mm. Pitch 316 is about 1.125 times the length of pitch 314, in one example. As such, the pitch gradient 324 is greater than zero (0). In one or more examples, the pitch gradient 324 is defined as: 0.005 mm< {$(P_{n+2}-P_{n+1})-(P_{n+1}-P_n)$}>0.125 mm, where n is a given point, and n+1 is an immediately adjacent point and the point n is closer to the base 204. In one or more examples, the pitch gradient 324 is defined as: 0.005 mm< {$(P_{n+2}-P_{n+1})-(P_{n+1}-P_n)$}>0.166 mm. For example, $P_n$ can be pitch 314, $P_{n+1}$ is pitch 316, and $P_{n+2}$ is pitch 318, and the initial point can be point 303.

In one or more examples, the pitch gradient 324 can increment such that that a given pitch, $P_n=P_0+(n*s)$, where n is a number of a given pitch in a given set of pitches, $P_0$ is the first pitch in the sequence of pitches, and s is a step. The step (s) can be between about 0.005 mm and about 0.166 mm, such as about 0.0156 mm, 0.020 mm, or about 0.125 mm. In one or more examples, the step (s) can be equal to the initial pitch, $P_0$. In this example, $P_0$ can be a distance equal to pitch 314, and $P_n$ can be any one of the pitches 314-322. As noted above, the pitch gradient 324 can increase in the direction of gravity. Advantageously, the filament 248 with the pitch gradient 324 can have a 20 percent longer operational period than a conventional filament, extending the useful life of the lamp 200. In one or more examples, the pitch gradient 324 can increase between about 2 percent and about 6 percent between successive pitches, such as about 2 percent, 3 percent, 4 percent, 5 percent, or about 6 percent.

Figure 4:
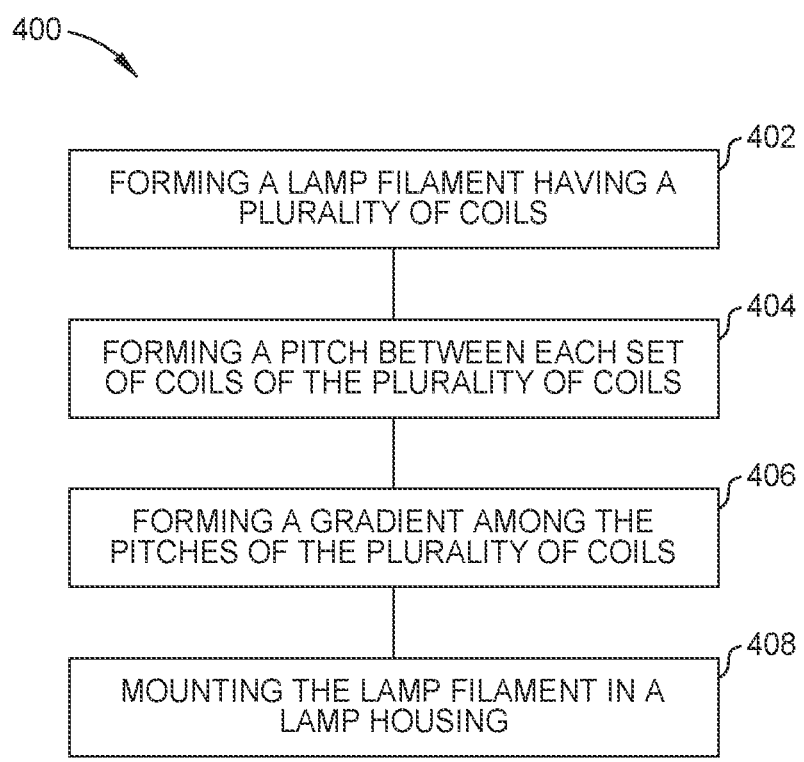
FIG. 4 is a flow chart of an exemplary method for forming the filament shown in FIG. 3, according to one implementation.

FIG. 4 a flow chart of an exemplary method for forming the filament 248 shown in FIG. 3. The method begins at operation 402 where a lamp filament is formed having a plurality of coils. In one or more examples, the wire is formed by mixing materials and drawing the materials through a mold, e.g., a shaped orifice, in order to form the wire 308. The wire is wound around a mandrel, e.g., a cylindrical bar, in order to form the filament 248. In one or more examples, the filament 248 undergoes annealing in order to soften the wire and make the filament 248 uniform. After the filament 248 is formed, the mandrel is removed after the annealing process. The mandrel can be dissolved in an acid that does not damage the filament 248. In one or more examples, the mandrel is formed of a metallic material that is different from the material of the wire 308. In one or more examples, the filament 248 having coiled section 252 and a ground 260 is partially formed.

At operation 404, a pitch is formed between each set of coils among the plurality of coils. In one or more examples, the pitch is formed in the mandrel, as described above. The wire 308 is wound around the mandrel, forming a helical filament having plural coils. A pitch is formed between each set of coils along a predetermined length of the wire 308. According to the method disclosed herein, a pitch is different between sets of two adjacent coils. For example, for given points 305-307 of the filament 248, a first pitch 314 is formed between the first point 303 and the second point 305. A second pitch 316 is formed between the second point 305 and the third point 307. A successive coil is formed having a successive pitch. The successive coil can include one or more of the coils having the points 303-313, and/or the successive coil can be coupled to the coils having the points 303-313. The successive pitch is defined by: $P_n=P_0+(n*s)$, where n is a number of a given pitch in a given set of pitches, $P_0$ is the first pitch, and s is a step, the step being a positive real number. A terminal coil is formed with a terminal pitch, such as the pitch 322. The terminal coil is electrically coupled to the first coil and all of the coils in the filament 248. The pitch gradient 324, in one or more examples, increases by about 2 percent of the first pitch 314. In one or more examples, the pitch gradient 324 increases by about 6 percent of the first pitch 314 between the first coil and the terminal coil. The terminal coil is the coil that includes the sixth point 313 and all points distanced 180 degrees (πradians) or more therefrom. As shown disposed in the lamp 200, the terminal pitch is closest to the tip 222 of the dome 220.

The method 400 proceeds to operation 406 where a pitch gradient is formed among the pitches formed at operation 404. In one or more examples, the pitch gradient 324 is formed by varying the plurality of pitches formed along the length of the mandrel. For example, in a conventional filament, each pitch between adjacent coils is substantially equal. In the disclosed method, the pitch gradient 324 is formed by engraving pitches within the mandrel such that no two pitches are equal. Accordingly, the differences between adjacent pitches is also not equal, in the direction of increasing coils, e.g., a direction extending from the base 204 to the tip 222. Additionally, the filament is formed such that no two pitches are equal, among the plurality of pitches 314-322. The pitch gradient 324 can increase in a substantially linear manner, as described above.

At operation 408, the filament is mounted in a lamp housing. The filament 248 can be attached to lead-in wires (not shown), which couple to the electrodes 240 disposed within the base 204. In one example, the lead-in wires includes hooks at their ends, which can be pressed over the end of or soldered to the upstream terminal 326 and the downstream terminal 328. In yet another example, the wire 308 is directly coupled to the circuitry within the base 204. A bulb (such as the dome 220) is placed over the filament 248, and the bulb is filled with gas, thus forming the lamp 200, as disclosed in detail above.

While operations 402-406 are described above as distinct operations, it is understood that two or more operations 402-406 can occur together or substantially simultaneously. For example, a pitch gradient can be formed in the mandrel. As the wire 408 is wrapped around the mandrel, one coil is formed for each 2π (360 degree) evolution of the wire around the mandrel from an originating point of a first coil, thus forming a plurality of coils. As the wire continues around the mandrel at 4π (720 degrees) from the originating point of the first coil, a second coil is formed. A pitch is formed between a point on the first coil and a point on a second coil. As the wire continues around the mandrel at 6π (1080 degrees) from the originating point of the first coil, a third coil is formed. A pitch gradient 324 is formed when the pitch formed between the third coil and the second coil is greater than the pitch formed between the second coil and the first coil. The operations 402-406 continue until a desired filament length is reached.

Disclosed above is a method and apparatus for measuring and testing lamp dimensions for three-dimensionally printed lamp filaments. Advantageously, a lamp having the filament disclosed herein increases the useful lifespan of the lamp by slowing deformation of the filament due to metal fatigue caused by heating and cooling of the filament under gravitational stress. While the foregoing is directed to specific examples, other examples may be devised without departing from the basic scope thereof, and the scope thereof is determined by the claims that follow.

What I claim is:

1. A lamp, comprising:
   a bulb filled with a gas;
   a filament disposed within the bulb, the filament formed by mixing materials and drawing the materials through a mold to form a wire, and annealing the filament, the filament comprising a plurality of coils, and the plurality of coils comprising:
      a first coil having a first point,
      a second coil having a second point,
      a third coil having a third point, the first, second, and third points forming a pitch gradient, the pitch gradient defined by:
         a first pitch between the second point and the first point, and
         a second pitch between the third point and the second point, wherein the second pitch is greater than the first pitch, the second point is 360 degrees away from the first point, and the third point is 360 degrees away from the second point, and
      a terminal coil electrically coupled to at least the first coil, the second coil, and the third coil.

2. The lamp of claim 1, further comprising:
   a pair of electrodes electrically coupled to the filament; and
   a pair of pins electrically coupled to the pair of electrodes, the pair of pins configured to transfer energy to the filament.

3. The lamp of claim 1, wherein the wire of the filament has a diameter less than or equal to about 0.05 mm.

4. The lamp of claim 1, wherein the lamp has a length of about 127 mm.

5. The lamp of claim 1, wherein the pitch gradient increases between about 2 percent of the first pitch and about 6 percent of the first pitch between the first coil and the terminal coil.

6. The lamp of claim 1, the plurality of coils further comprising:
   a successive coil having a successive pitch, the successive pitch defined by: $P_n = P_0 + (n^* s)$, where n is a number of a given pitch in a given set of pitches, $P_0$ is the first pitch, and s is a step, the step being a positive real number.

7. The lamp of claim 6, wherein the terminal coil is electrically coupled to the successive coil.

8. A semiconductor processing chamber comprising:
   a lamp configured to provide heat to an internal volume of the semiconductor processing chamber, the lamp comprising:
      a bulb filled with a gas;
      a filament disposed within the bulb, the filament formed by mixing materials and drawing the materials through a mold to form a wire, and annealing the filament, the filament comprising a plurality of coils, and the plurality of coils comprising:
         a first coil having a first point,
         a second coil having a second point,
         a third coil having a third point, the first, second, and third points forming a pitch gradient, the pitch gradient defined by:
            a first pitch between the second point and the first point, and
            a second pitch between the third point and the second point, wherein the second pitch is greater than the first pitch, the second point is 360 degrees away from the first point, and the third point is 360 degrees away from the second point, and
         a terminal coil electrically coupled to at least the first coil, the second coil, and the third coil.

9. The semiconductor processing chamber of claim 8, further comprising:
   a pair of electrodes electrically coupled to the filament; and
   a pair of pins electrically coupled to the pair of electrodes, the pair of pins configured to transfer energy to the filament.

10. The semiconductor processing chamber of claim 8, wherein the pitch gradient increases between about 2 percent of the first pitch and about 6 percent of the first pitch between the first coil and the terminal coil.

11. A method of forming a lamp, the method comprising:
forming a filament for disposing in a bulb filled with a gas, the filament comprising a plurality of coils, and the forming of the filament comprising mixing materials and drawing the materials through a mold to form a wire;
forming a pitch gradient between a first coil of the plurality of coils having a first point, a second coil of the plurality of coils having a second point, and a third coil of the plurality of coils having a third point, wherein the pitch gradient is defined by:
a first pitch between the second point and the first point, and
a second pitch between the third point and the second point, wherein the second pitch is greater than the first pitch, the second point is 360 degrees away from the first point, and the third point is 360 degrees away from the second point; and
annealing the filament.

12. The method of claim 11, further comprising:
forming a successive coil, the successive coil disposed within the bulb and electrically coupled to the plurality of coils, wherein the successive coil has a successive pitch, the successive pitch defined by: $P_n = P_0 + (n^* s)$, where n is a number of a given pitch in a given set of pitches, $P_0$ is the first pitch, and s is a step, the step being a positive real number.

13. The method of claim 12, further comprising:
forming a terminal coil electrically coupled to at least the first coil and the successive coil.

14. The method of claim 13, wherein the pitch gradient increases between about 2 percent of the first pitch and about 6 percent of the first pitch between the first coil and the terminal coil.

15. The method of claim 11, wherein the forming of the filament further comprises winding the wire around a mandrel to form a filament.

16. The method of claim 15, wherein the mandrel is formed of a metallic material that is different from a material of the wire.

17. The method of claim 16, further comprising dissolving the mandrel in an acid.

18. The method of claim 15, wherein the forming of the pitch gradient comprises using engraved pitches that are engraved into the mandrel.

* * * * *